United States Patent [19]
Yzng

[11] Patent Number: 5,811,354
[45] Date of Patent: Sep. 22, 1998

[54] METHOD FOR PREVENTING POLYCIDE LINE DRIFT BY INCORPORATING DUMMY POLYCIDE CONTACT

[75] Inventor: Tse-Liang Yzng, Hsin-Chu, Taiwan

[73] Assignee: Taiwan Semiconductor Manufacturing Co. Ltd., Hsin-Chu, Taiwan

[21] Appl. No.: 721,757

[22] Filed: Sep. 30, 1996

[51] Int. Cl.⁶ ..................................... H01L 21/44
[52] U.S. Cl. ................ 438/682; 438/631; 438/637; 438/649; 438/657
[58] Field of Search ..................... 438/631, 637, 438/669, 688, 926, 682, 649, 657

[56] References Cited

U.S. PATENT DOCUMENTS 4,949,162  8/1990  Tamaki et al. .
5,436,411  7/1995  Pasch .
5,556,805  9/1996  Tanizawa et al. .

Primary Examiner—Caridad Everhart
Attorney, Agent, or Firm—Tung & Associates

[57] ABSTRACT

The present invention provides a method for preventing a polycide line situated between two poly-metal dielectric layers from drifting or deformation during a reflow process conducted for the dielectric layers by forming a dummy polycide gate and a dummy contact at a suitable location in the polycide line such that the dummy contact is anchored through the bottom dielectric layer to a dummy gate located on a field oxide isolation in the silicon substrate. The number of dummy contacts and the location for placing such contacts are determined by the length and the configuration of the polycide line and the topography of the dielectric layer that the polycide line is situated on.

14 Claims, 2 Drawing Sheets

5,811,354

METHOD FOR PREVENTING POLYCIDE LINE DRIFT BY INCORPORATING DUMMY POLYCIDE CONTACT

FIELD OF THE INVENTION

The present invention generally relates to a method for preventing a polycide line situated on a poly-metal dielectric (PMD) layer from drifting and more particularly, relates to a method for preventing a polycide line situated on a PMD layer from drifting by incorporating at least one dummy polycide contact through the PMD layer to provide additional anchoring of the polycide line.

BACKGROUND OF THE INVENTION

In recently developed semiconductor technology, polysilicon material which has been used in transistor gates is also being widely used in interconnects. However, one drawback of the polysilicon material when used as a long distance conductor in a semiconductor device is its relatively high sheet resistance, i.e., at between 20 and 40 ohm/square in a doped form. The high sheet resistance can cause a significant delay in a polysilicon wire when used as a long distance conductor.

One solution to solve the high sheet resistance problem of doped polysilicon is to reduce the resistance by combining the polysilicon material with a refractory metal. It is a desirable approach since no extra mask work is required for the fabrication process. Silicides for such semiconductor applications can be formed by reacting a refractory or near noble metal with silicon. For instance, more commonly used silicides are titanium silicide ($TiSi_2$), cobalt silicide ($CoSi_2$), tungsteri silicide ($WSi_2$), platinum silicide (PtSi), molybedenum silicide ($MoSi_2$), palladium silicide ($Pd_2Si$), and tantalum silicide ($TaSi_2$). A silicide, such as silicon and tantalum, can be used alone as a gate material presenting a sheet resistance of 1~5 ohm/square. Silicides can also be used in a sandwich form with polysilicon which is commonly known as a polycide. Polycide is therefore a condensed name for polysilicon-silicide. A polycide gate can achieve a low sheet resistance of less than 10 ohm/square which, represents a significant improvement from that of polysilicon alone. The more commonly used silicides are tungsten silicide, tantalum silicide and molybedenum silicide. These suicides are refractory metal suicides and therefore they are thermally stable and resistant to processing chemicals.

When a polycide gate or line is used on a semiconductor device, a silicide layer is first blank deposited over a layer of polysilicon and then, the composite layers are patterned together. Based on its desirable low sheet resistance, the polycide structure can be advantageously used for local routing over short distances in the form of a polycide line. It is particularly desirable when only one or two levels of metals are used in a circuit as interconnects, since polycide lines can help to reduce the device size significantly.

When a polycide line is used in a multi-layer interconnect environment such as in a structure of a dynamic random access memory (DRAM), a dielectric material must be used in between the layers for insulation. For instance, to insulate a first metal layer from a silicon substrate, a dielectric material is typically deposited, planarized, and then patterned to define openings for contacts to silicon and polysilicon. This type of insulating dielectric material deposited is commonly referred to as a poly-metal dielectric (PMD) material. An ideal PMD material must satisfy several property requirements. For instance, it must be contamination-free, it must exhibit a dielectric constant approaches unity, and it must have a sufficiently high field strength and etch selectivity to underlaying materials such as silicides, silicon and polysilicon. It must also have gap filling capability in sub-half micron devices, it must also have good adhesion to the substrate and the overlaying metal, and it must also be a good barrier to ionic contaminants. It would be desirable that the PMD material can be easily planarized to facilitate subsequent fabrication steps.

More commonly used dielectric materials for PMD are boro-phophosilicate glass (BPSG), boro-phospho-tetra-ethoxy-silicate (BPTEOS) glass, phosphosilicate glass (PSG) and undoped silicate glass (USG). For instance, a typical PMD layer consists of a thick film (between about 5,000 Å and about 10,000 Å) of BPSG or BPTEOS which can be densified and reflowed at a temperature between 700°~900° C., and preferably at between 750°~850° C. The reflow process of the PMD layer is important since a reflowed doped glass conformably covers steps and fills gaps between polycide lines and forms a nearly planar surface which is essential for subsequent fabrication steps. During a reflow (or planarization) process of a PMD layer in a semiconductor structure which has more than one PMD layers, problem occurs when the top PMD layer is heated to a temperature above its glass transition temperature to enable the material to flow.

Referring initially to FIG. 1 A, where a semiconductor device 10 is shown. In the semiconductor device 10, a bird's beak field oxide isolation 12 is first formed in the surface of a silicon substrate 14. A PMD layer 16 of either BPSG or BPTEOS material is then deposited on top of the substrate and the field oxide isolation. After a polycide line 18 formed of a polysilicon layer 20 and a metal silicide layer 22 is deposited and patterned, a second PMD layer 26 is deposited of a similar material as that in the first PMD layer on top of the first PMD layer covering the polycide line. The surface 28 of the second PMD layer 26 is not planar and therefore must be planarized before the next fabrication step can be carried out.

The second PMD layer 26 is reflowed at a reflow temperature that is higher than the glass transition temperature of the PMD material of either BPSG or BPTEOS, i.e., a reflow temperature in the range between 750°~850° C. is used. The top surface 30 of the second PMD layer 26 becomes substantially planar, however, at the expense of a deformed polycide line 18 which has drifted away from its original position by distance 32. This is shown in FIG. 1B.

The phenomenon of the dislocation or the drifting of the polycide line 18 can be explained as follows. During the reflow process of the second PMD layer 26, the temperature of the device 10 must be raised to a temperature that is above the glass transition temperature of the dielectric material. Since the second PMD layer and the first PMD layer are usually deposited of a similar material, the reflow temperature required for the second PMD layer is also above the glass transition temperature of the first PMD layer. As a consequence, both the first and the second PMD layers 16 and 26 are in a liquid state with the polycide line 18 suspended in the middle of two liquid layers. The polycide line 18 therefore drifts or deforms depending on the topography of the first PMD layer 16.

The drift or deformation of a polycide line can also be examined from FIGS. 2 and 3. FIG. 2 shows a polycide line 36 which has two polycide contacts 38 and 40. Prior to the reflow process, the polycide line 36 is in a straight line as originally patterned in a previous fabrication step. After a reflow process is carried out at a temperature higher than the glass transition temperature of the two PMD layers of which the polycide line is sandwiched therein between, the line drifts to the right at its middle point since there is no support by the underlaying PMD layer. The polycide contacts 38 and 40 have not moved since they are anchored to polysilicon gate structures situated in the first PMD layer.

A similar deformation of another polycide line 46 is shown in FIG. 3. While the polycide contact 48 has not moved because it is anchored to a gate structure below, the polycide line 46 has drifted to the right since the lower part of the polycide line 46 is not anchored and therefore is free to move when the first and the second PMD layers change into a liquid state during the reflow process. It should be noted that the drifting or deformation shown in FIGS. 2 and 3 are for illustration purpose only, and the true drifting or deformation depends on the topography of the PMD layer on which the polycide line is situated. The drifting or deformation of polycide lines presents a serious problem for the semiconductor device since the polycide line may be drifted away from its original position and as a result, comes in contact with other unintended via or interconnect and causing a short in the device. The drifting or deformation of the polycide line must therefore be controlled or avoided.

It is therefore an object of the present invention to provide a method for preventing a polycide line situated on a dielectric layer in a semiconductor device from drifting during a reflow process of the dielectric layer.

It is a another object of the present invention to provide a method for preventing a polycide line situated in a semiconductor device from drifting that does not require significant modification of the fabrication process.

It is a further object of the present invention to provide a method for preventing a polycide line from drifting that can be easily integrated into an existing fabrication process for the semiconductor device.

It is yet another object of the present invention to provide a method for preventing a polycide line from drifting by incorporating at least one inactive polycide contact to anchor the polycide line to an underlaying inactive gate structure.

It is still another object of the present invention to provide a method for preventing a polycide line in a semiconductor device from drifting during the reflow process of a dielectric layer by incorporating a dummy polycide contact through a polycide line and a PMD layer such that the dummy contact is anchored to a dummy gate structure.

It is another further object of the present invention to provide a semiconductor structure that has at least one polycide line situated in between two PMD layers that does not have a drifting or deformation problem during a reflow process for the PMD layers.

SUMMARY OF THE INVENTION

In accordance with the present invention, a method for preventing a polycide line situated in between two dielectric layers in a semiconductor device from drifting or deformation during a reflow process for the dielectric layers is provided.

In a preferred embodiment, a method for preventing a polycide line situated between two poly-metal dielectric layers from drifting during a reflow process can be carried out by first providing a silicon substrate and forming at least one field oxide isolation for isolating active devices in the substrate, then forming at least one inactive gate on the at least one field oxide isolation, depositing a first PMD layer on the at least one field oxide isolation and the at least one inactive gate, forming a polycide line on the first PMD layer for providing electrical communication to the active devices, forming at least one inactive polycide contact through the polycide line and the first PMD layer to contact the inactive gate, and then depositing a second PMD layer on the polycide line and the at least one inactive polycide contact.

The present invention is also directed to a semiconductor structure that has a silicon substrate, at least one field oxide isolation formed on the substrate for isolating active devices, at least one dummy gate formed on the at least one field oxide isolation, a first PMD layer on the at least one dummy gate, at least one polycide line on the first PMD layer for providing electrical communication to the active devices, at least one dummy polycide contact formed through the polycide line and the first PMD layer connecting to the at least one dummy gate, a second PMD layer on the at least one polycide line and the at least one dummy contact.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a novel method for preventing a polycide line situated between two poly-metal dielectric layers from drifting during a reflow or planarization process for the dielectric layer. The method can be easily carried out without making significant changes in the fabrication processes. The method consists of the step of forming a dummy (or inactive) polycide contact through the polycide line, i.e., at the middle of a polycide line, that is anchored to a dummy (or inactive) gate structure on a field oxide isolation situated in the underlying dielectric layer. The method can be advantageously carried out with only minimal changes made in the present fabrication process. For instance, the only processing steps that require modification are the masking steps for the polysilicon gates, for the contact hole, and for the dummy polycide contact. The same masking, etching and forming steps for the semiconductor device can be practiced by merely adding a few openings for the additional dummy polycide contacts. The number and the location of the dummy polycide contacts that are required to be anchored to the dummy polysilicon gates can be determined in each particular application generally by the length and the configuration of the polycide lines that are to be anchored against drifting or deformation. For instance, a longer polycide line would require more dummy polycide contacts for anchoring than a shorter polycide line. It has been determined that when the length of a polycide line is less than approximately 15 micron, at least one dummy polycide contact should be used to anchor the line in order to prevent drifting or deformation. When the length of the polycide line is more than 15 micron, then one dummy contact should be used for each 15 micron length of the line to prevent drifting and deformation. The present invention novel method can also be used to anchor a polycide bulk in a similar way as in the polycide lines. Since polycide contacts are frequently designed and positioned along the edges of a polycide bulk, the polycide drifting and deformation problem can also effect the performance of a polycide bulk.

Figure 1A:
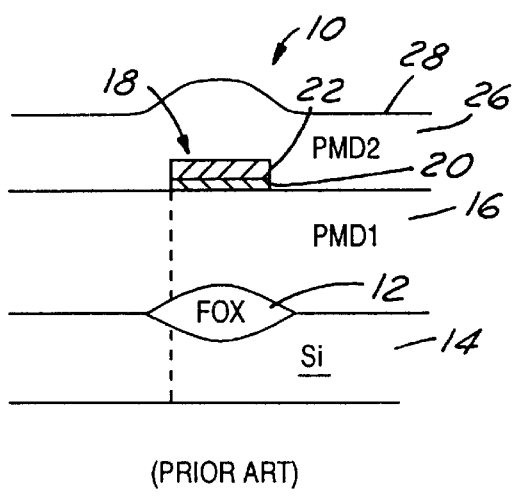
FIG. 1A is an enlarged, cross-sectional view of a conventional semiconductor structure that has a polycide line situated in between two dielectric layers.
Figure 2:
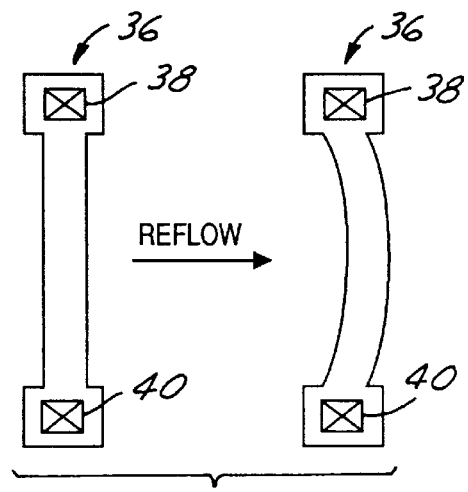
FIG. 2 is an illustration showing a polycide line having two polycide contacts before and after a reflow process.
Figure 1B:
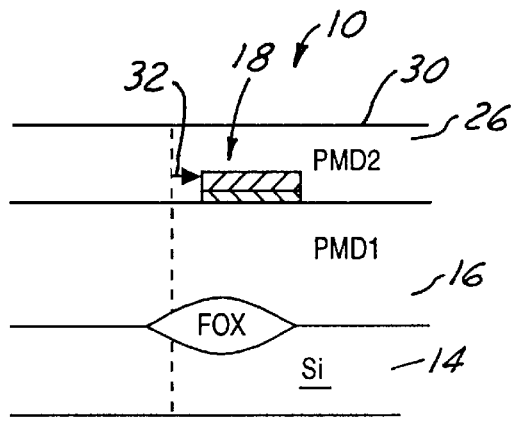
FIG. 1B is an enlarged, cross-sectional view of the conventional semiconductor structure shown in FIG. 1A after a reflow process on the second PMD layer is carried out.
Figure 3:
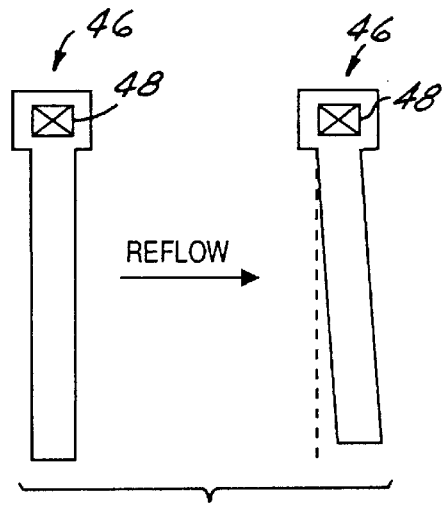
FIG. 3 is an illustration showing a polycide line having one polycide contact before and after a reflow process.
Figure 4A:
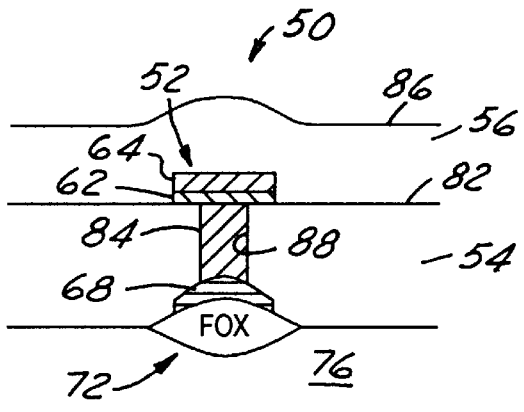
FIG. 4A is an enlarged, cross-sectional view of a present invention semiconductor device that has a polycide line situated in between two dielectric layers prior to a reflow process.

Referring now to FIG. 4A where a present invention semiconductor structure 50 having a polycide line 52 situated between a first PMD layer 54 and a second PMD layer 56 is shown.

The polycide line is formed by the sequential deposition of a polysilicon layer 62 and a metal silicide layer 64. The metal silicide layer 64 can be formed of anyone of the following metal silicide materials, i.e., titanium silicide, cobalt silicide, tungsten silicide, platinum silicide, molybdenum silicide, palladium silicide and tantalum silicide. In the present invention semiconductor structure 50, a dummy polysilicon gate 68 is first formed on a field oxide isolation (a bird's beak FOX) 72 situated in a silicon substrate 76. The dummy (or inactive) polysilicon gate 68 can be formed in the same masking, etching and deposition steps that other active gates are formed on the silicon substrate 76. The only modification required for the fabrication process is the minor changes required in the patterning or masking step for providing additional windows for the dummy gates. No other changes in the processing steps is necessary for forming the dummy gate structures. It should be noted that while a polysilicon gate structure 68 is shown in this preferred embodiment, any other gate structure formed of other materials can also be used. It should also be noted that while a bird's beak FOX is shown in the preferred embodiment, other FOX structures such as a shallow trench isolation, etc., can also be used.

In the next processing step, a poly-metal dielectric layer 54 (a first PMD layer) is deposited by a chemical vapor deposition process to substantially cover the silicon substrate 76, the dummy polysilicon gate 68, the bird's beak field oxide isolation 72, and any other active or dummy gate structures. The PMD layer 54 is then planarized by a reflow process wherein the semiconductor structure 50 is subjected to a reflow temperature that is higher than the glass transition temperature of the PMD material. For instance, when a PMD material such as BPSG, BPTEOS, or PSG is used, a reflow temperature at between about 700° C. and about 900° C. can be suitably used to cause the material to flow and to obtain a substantially planar top surface. A more preferred range of reflow temperature is between about 750° C. and 850°C.

After the top surface 82 of the PMD layer 54 is planarized, an additional window for the dummy contact 84 is opened for the contact hole 88 in the PMD layer 54. This can be achieved by a simple modification of the masking and patterning step for active contact holes (not shown) and as such, no additional processing step is needed for providing contact hole 88 for the dummy contact. The contact hole 88 may then be filled by depositing a polysilicon, a metal or any other suitable contact materials. After an etch-back process to remove the excess contact material from surface 82 of the PMD layer 54, a polycide line 52 can be formed by the sequential deposition of a polysilicon layer and a metal silicide layer, and masking and patterning for forming the polycide line 52. After the photoresist layer (not shown) is removed, a second PMD layer 56 of a suitable dielectric material (such as that used in the first PMD layer 54) can be deposited on top of the polycide line 52 and the first PMD layer 54. A substantially non-planar surface 86 is formed. This is shown in FIG. 4A.

Figure 4B:
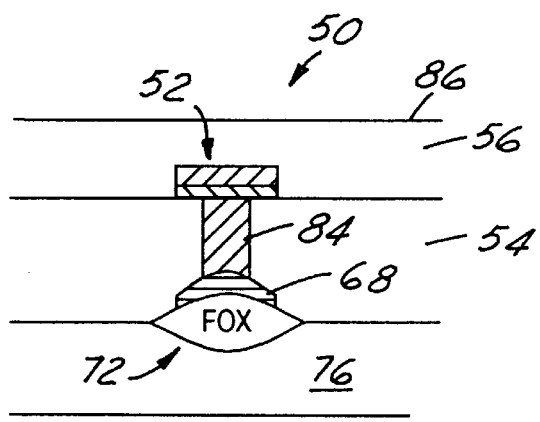
FIG. 4B is an enlarged, cross-sectional view of a present invention semiconductor device that has a polycide line situated in between two dielectric layers after a reflow process for the dielectric layers is conducted.

The present invention advantageous result can be seen in FIG. 4B where an enlarged, cross-sectional view of the semiconductor structure 50 after a reflow process for the second PMD layer 56 is conducted is shown. It is seen that while the top surface 86 of the second PMD layer 56 is substantially planarized, the polycide line 52 has not drifted away from its original position held prior to the reflow process. The advantageous result is achieved because the polycide line 52 is firmly anchored to the bird's beak field oxide 72 through the dummy gate 68 and the dummy contact 84. It should be noted that while dummy gate 68 (as shown in FIG. 4B) is formed on a bird's beak field oxide 72, it can be formed on any other inactive structure such as a shallow trench field oxide structure, etc.

Figure 5:
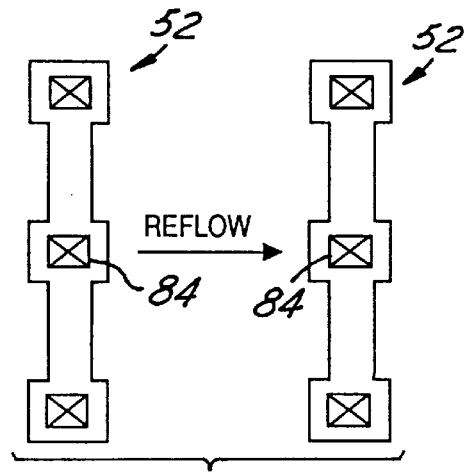
FIG. 5 is an illustration showing a polycide line of the present invention having a dummy contact built in the middle of the line before and after a reflow process.

FIG. 5 is an illustration of a top view showing the beneficial effect of the present invention dummy contact 84 that is formed at the middle section of the polycide line 52. It is seen that no bending of the polycide line 52 has occurred after a reflow (or planarization) process for the dielectric layers due to the anchoring effect of the dummy contact 84.

It should be noted that while it is not shown in FIGS. 4A and 4B, a layer of undoped silicate glass (USG) is frequently used as an additional coating layer on top of the polycide line situated in between the two dielectric layers. The function of the USG layer is to act as a barrier to stop any possible dopant ion migration from the doped dielectrical materials. Since the USG layer does not flow at normal reflow temperatures for the dielectric layers, the thickness of the USG layer should be limited in order to minimize any step height increase. A suitable thickness of the USG layer used is usually less than 2000 Å, and preferably less than 1000 Å.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for preventing a polycide line situated between two poly-metal dielectric layers from drifting during a reflow process comprising the steps of:

provding a silicon substrate and forming at least one field oxide isolation for isolating active devices in said substrate, forming at least one inactive gate on said at least one field oxide isolation, depositing a first poly-metal dielectric layer on said at least one field oxide isolations and said at least one inactive gate, forming at least one inactive contact through said first poly-metal dielectric layer connecting to said at least one inactive gate, forming at least one polycide line on said at least one inactive contact and said first poly-metal dielectric layer for connecting to said at least one inactive contact, and, depositing a second poly-metal dielectric layer on said at least one polycide line and said first poly-metal dielectric layer.

2. A method according to claim 1 further comprising the step of planarizing said second poly-metal dielectric layer by a reflow process.

3. A method according to claim 2, wherein said reflow process is conducted at a temperature not less than the glass transition temperature of said second poly-metal dielectric layer.

4. A method according to claim 1, wherein said at least one field oxide isolation is a bird's beak isolation or a shallow trench isolation.

5. A method according to claim 1, wherein said at least one inactive gate is a dummy gate and said at least one inactive contact is a dummy contact.

6. A method according to claim 1, wherein said at least one polycide line is formed by first depositing a polysilicon layer and then depositing a metal silicide layer.

7. A method according to claim 6, wherein said metal silicide layer is selected from the group consisting of titanium silicide, cobalt silicide, tungsten silicide, platinum silicide, molybdenum silicide, palladium silicide and tantalum silicide.

8. A method according to claim 6, wherein said metal silicide layer is formed of a refractory metal silicide.

9. A method according to claim 1, wherein said first and said second poly-metal dielectric layers are formed of a material selected from the group consisting of boro-phosphosilicate glass (BPSG), boro-phospho-tetra-ethoxy-silicate (BPTEOS) glass and phosphosilicate glass (PSG).

10. A method according to claim 1, wherein said first and second poly-metal dielectric layers are deposited by a chemical vapor deposition technique.

11. A method according to claim 1, wherein said at least one inactive gate is formed of polysilicon or metal.

12. A method according to claim 1 further comprising the step of depositing a barrier layer on said at least one polycide line to stop dopant ion migration from said dielectric layer.

13. A method according to claim 12, wherein said barrier layer is deposited of undoped silicate glass (USG).

14. A method according to claim 1, wherein said at least one polycide line is a polycide bulk.

* * * * *